United States Patent

Sono et al.

Patent Number: 5,861,669
Date of Patent: Jan. 19, 1999

[54] SEMICONDUCTOR PACKAGE FOR SURFACE MOUNTING

[75] Inventors: Michio Sono; Junichi Kasai; Masanori Yoshimoto; Kazuto Tsuji; Kouji Saito, all of Kawasaki, Japan

[73] Assignee: Fujitsu Limited, Kawasaki, Japan

[21] Appl. No.: 488,673

[22] Filed: Jun. 7, 1995

Related U.S. Application Data

[62] Division of Ser. No. 330,737, Oct. 28, 1994, abandoned, which is a continuation of Ser. No. 881,899, May 12, 1992, abandoned.

[30] Foreign Application Priority Data

| May 17, 1991 | [JP] | Japan | 3-113483 |
| Jul. 3, 1991 | [JP] | Japan | 3-162976 |
| Oct. 2, 1991 | [JP] | Japan | 3-255415 |
| Mar. 11, 1992 | [JP] | Japan | 4-52434 |

[51] Int. Cl.$^6$ .................................................. H01L 29/41
[52] U.S. Cl. ........................ 257/696; 257/666; 257/672; 257/723
[58] Field of Search ................................. 257/666, 672, 257/696, 723

[56] References Cited

U.S. PATENT DOCUMENTS

| 4,441,119 | 4/1984 | Link | 257/672 |
| 4,967,262 | 10/1990 | Farnsworth | 357/75 |
| 4,975,763 | 12/1990 | Baudouin et al. | 357/74 |
| 5,147,815 | 9/1992 | Casto | 257/666 |
| 5,245,215 | 9/1993 | Sawaya | 257/723 |

FOREIGN PATENT DOCUMENTS

| 0 333 374 | 9/1989 | European Pat. Off. |
| 52-166467 | 6/1951 | Japan . |
| 60-241241 | 11/1985 | Japan . |
| 60-242653 | 12/1985 | Japan . |
| 61-174656 | 8/1986 | Japan . |
| 62-243348 | 10/1987 | Japan . |
| 63-169055 | 7/1988 | Japan . |
| 1-089353 | 4/1989 | Japan . |
| 1-166545 | 6/1989 | Japan . |
| 1-140844 | 9/1989 | Japan . |
| 1-230254 | 9/1989 | Japan . |
| 1-230265 | 9/1989 | Japan . |
| 2-110960 | 4/1990 | Japan . |
| 2-125651 | 5/1990 | Japan . |
| 3-104265 | 5/1991 | Japan . |
| 3-129866 | 6/1991 | Japan . |

OTHER PUBLICATIONS

Patent Abstracts of Japan, vol. 11, No. 359 (E–559), Nov. 12, 1987 & JP–A–62 136 060 (Mitsubishi Electric Corp.), Jun. 19, 1987.
Patent Abstracts of Japan, vol. 12, No. 435 (E–683), Nov. 16, 1988 & JP–A–63 169 055 (NEC Corp.), Jul. 13, 1988.
Patent Abstracts of Japan, vol. 14, No. 324 (E–951), Jul. 11, 1990 & JP–A–02 109 357 (Sumitomo Special Metals Co.), Apr. 23, 1990.

Primary Examiner—Jerome Jackson, Jr.
Attorney, Agent, or Firm—Staas & Halsey

[57] ABSTRACT

A semiconductor device having a package of a single in-line type includes a semiconductor chip, a package body that accommodates the semiconductor chip therein and defined by a pair of opposing major surfaces and a plurality of interconnection leads held by the package body to extend substantially perpendicularly to a bottom surface. Each of the interconnection leads consists of an inner lead part located inside the package body and an outer lead part located outside the package body, the outer lead part being bent laterally at a boundary between the inner part and the outer part, in one of first and second directions that are opposite from each other and substantially perpendicular to the opposing major surfaces of the package body. A plurality of support legs extend laterally at the bottom surface of the package body for supporting the package body upright when the semiconductor device is placed on a substrate.

38 Claims, 18 Drawing Sheets

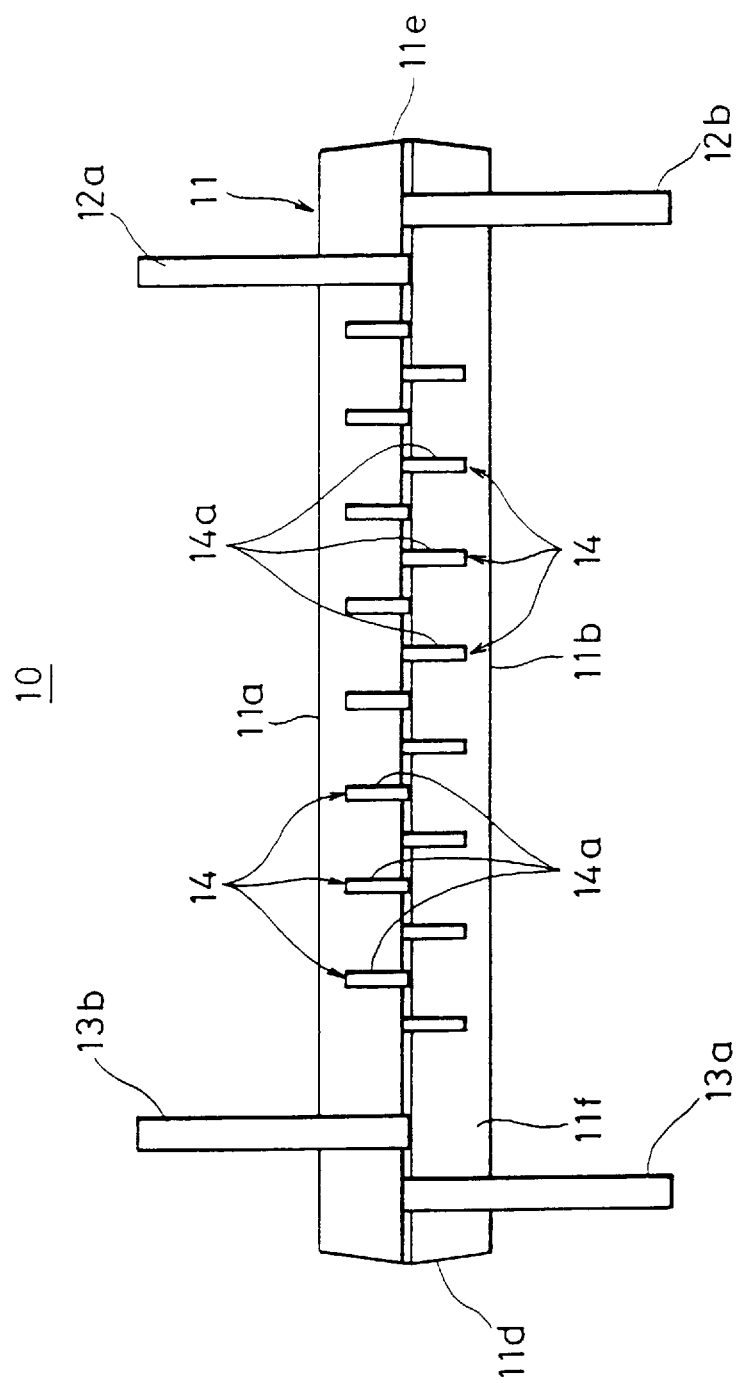

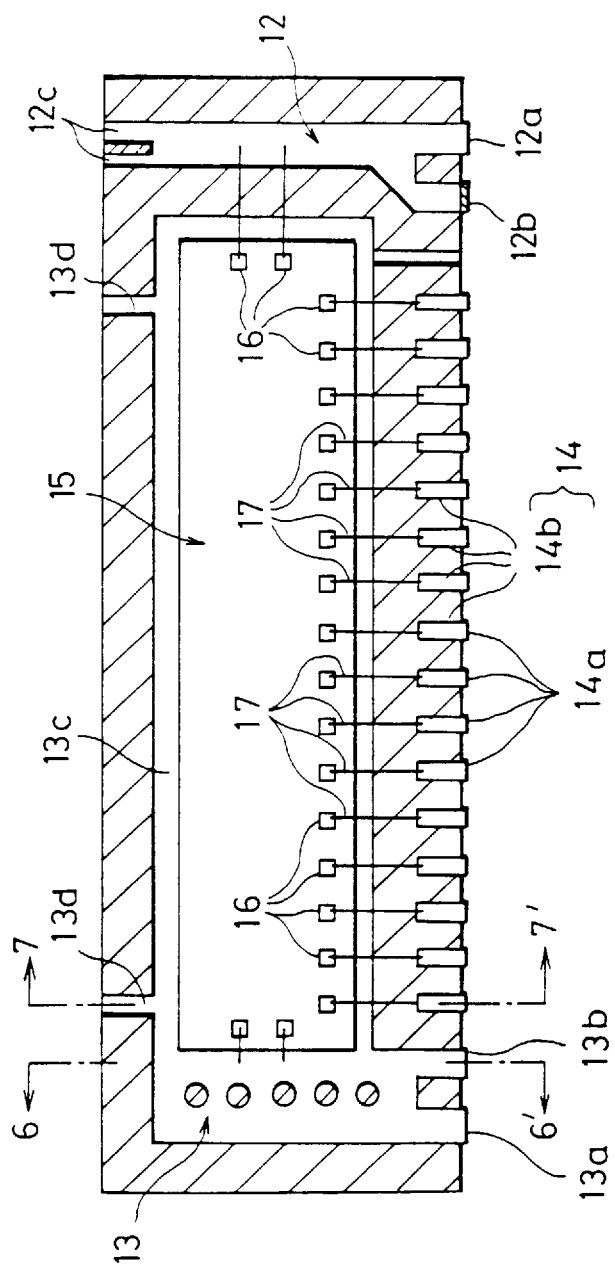

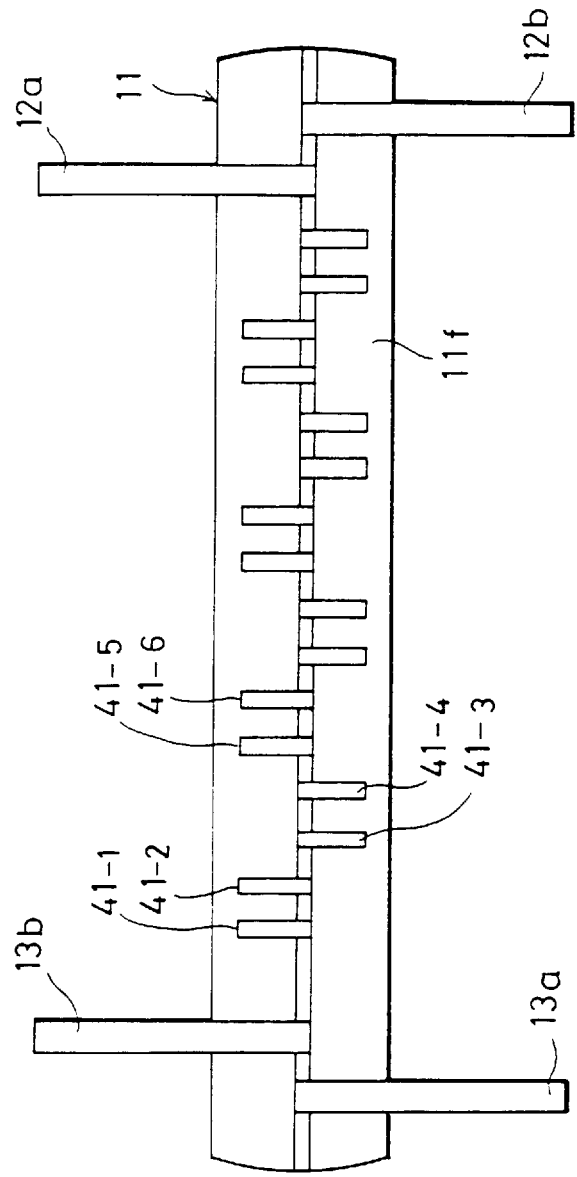

FIG. 17
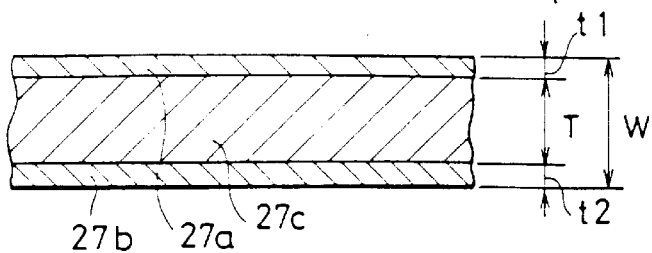
FIG. 18
| EXAMPLE | THICKNESS | | |
|---|---|---|---|
| | Fe-ALLOY(t) | Cu-ALLOY(T) | Fe-ALLOY(t) |
| (1) | 20 | 110 | 20 |
| (2) | 25 | 100 | 25 |
| (3) | 30 | 90 | 30 |
| (4) | 40 | 70 | 40 |
| (5) | 50 | 50 | 50 |
W=150 μm
FIG. 19A
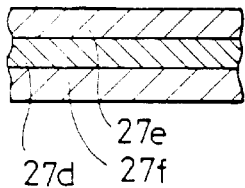
FIG. 19B
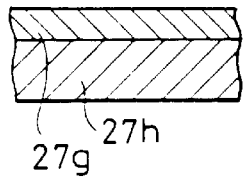
FIG. 19C
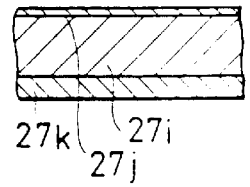

28a

28b

28c

28d

28e

28f

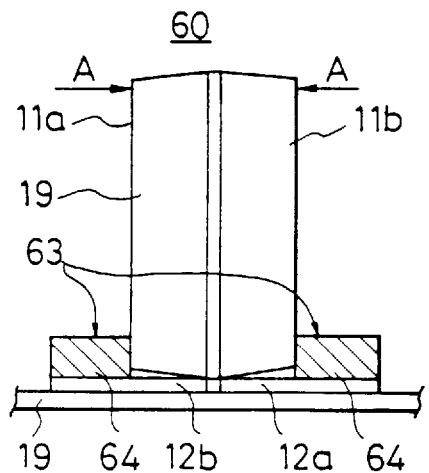
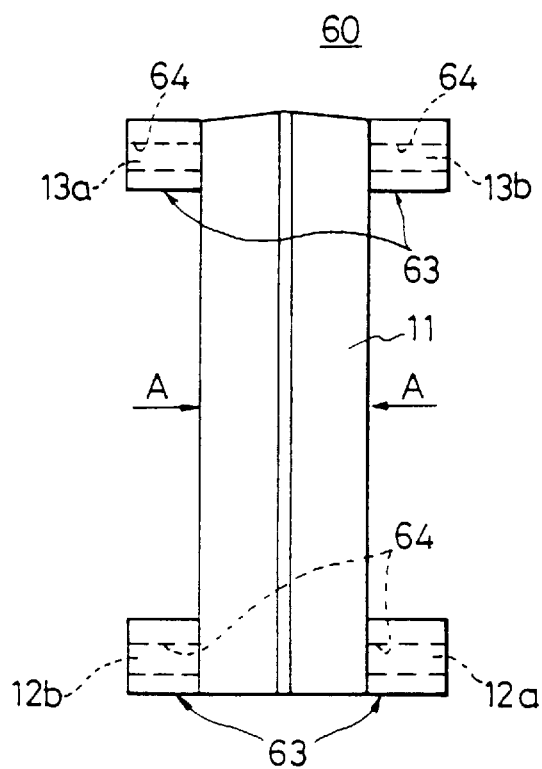

SEMICONDUCTOR PACKAGE FOR SURFACE MOUNTING

This application is a division of application Ser. No. 08/330,737, filed Oct. 28, 1994 and now abandoned, in turn a continuation of application Ser. No. 07/881,899, filed May 12, 1992 and now abandoned.

BACKGROUND OF THE INVENTION

The present invention generally relates to semiconductor devices and more particularly to a semiconductor package that has a single in-line package structure.

In order to improve the efficiency of mounting of semiconductor devices on a support substrate such as a printed circuit board, a package structure designed for surface mounting is used extensively. By using the surface mounting technology, the semiconductor device can be mounted on the circuit board without providing holes for inserting leads of the device. The soldering of the leads is achieved by merely placing the device on the circuit board and passing the device and the circuit board through a heating furnace for causing a reflow of soldering alloy. Thereby, the efficiency of the mounting process is improved significantly and the fabrication cost of electronic apparatuses that use the semiconductor devices is significantly reduced.

In order to mount as many as possible of the semiconductor devices on a single support substrate, a so-called single in-line package (SIP) is proposed. In the single in-line package, the leads are provided along a single edge of a flat package body to extend perpendicularly with respect to the edge, and the package body is held upright on the substrate by inserting the leads into the corresponding holes of the substrate. As the package body is held vertically on the substrate, one can increase the number of the packages that are mounted on the single substrate. Further, such a structure is advantageous for cooling the device.

In order to combine the advantageous features of the single in-line package with the advantageous features of the surface mounting technology, a package structure shown in FIG. 1 is proposed in U.S. Pat. No. 4,975,763.

Referring to FIG. 1, the package designated by a numeral 1 includes a flat resin package body 2 that accommodates therein a semiconductor chip 3. At an edge 2*a* of the flat package body 2, there are provided a number of leads each having an inner lead part 4*a* connected to a bonding pad of the chip 3 and an outer lead part 4*b* extending outward from the edge 2*a*. Further, the outer lead part 4*b* of the leads 4 is bent laterally with respect to the extending direction of the leads 4. In order to support the package body 2 on the substrate at the time of mounting, there is provided a pair of studs 5 each including a stop portion 6 and a cylindrical clip portion 7 of a reduced diameter for inserting into a corresponding hole provided on the substrate.

FIG. 2 shows the mounting of the package 1 on a substrate 8, wherein the substrate 8 is formed with a hole 8*a* for holding the clip portion 7 of the stud 5. There, the portion 7 is inserted into the hole 8*a* as shown in FIG. 2 and the package body 2 is held upright on the substrate 8. The substrate 8 carries thereon a conductor pattern 8*b* for wiring, and the lead 4 is contacted with the conductor pattern 8*b* when the package 1 is held on the substrate 8. By passing the substrate 8 together with the package 1 in the state shown in FIG. 2 through a heating device, the soldering alloy provided on the conductor pattern 8*b* causes a reflow and the lead 4 is soldered firmly upon the conductor pattern 8.

In this conventional package structure, there is a problem in that one has to provide the hole 8*a* on the substrate 8 in correspondence to the stud 5 for holding the package body 2 on the substrate 8. As each lead 4 has to engage with a corresponding pattern 8*b* when the package is mounted, it is necessary that the hole 8*a* be formed with high precision. This requirement is particularly acute in recent semiconductor devices that have a large number of leads on the package body. Obviously, such a formation of the hole and the insertion of the stud into the hole undermine the advantageous features of surface mounting technology, and the efficiency of mounting is decreased.

The package of FIG. 1 has another drawback in that each lead 4 has to extend straight from the package body 2 at least for a distance corresponding to the length of the stop portion 6 of each stud 5. This straight part of the lead 4 does not contribute to anything and causes an unwanted delay of the electrical signals that is carried therethrough. With the increasing operational speed of semiconductor devices, such a delay may cause a serious problem in the exchange of electric signals between the chip and the conductor pattern on the substrate. Further, such a structure having a long, exposed lead is vulnerable to external noises. As long as the studs are used for supporting the package body on the substrate, one cannot reduce the length of the lead cannot be satisfactorily reduced.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a package of the single in-line type suitable for surface mounting, wherein the efficiency of mounting on a substrate is improved.

Another object of the present invention is to provide a semiconductor device having a package of a single in-line type, wherein the package has a structure that reduces the delay of electric signals.

Another object of the present invention is to provide a semiconductor device having a package of a single in-line type, comprising: a semiconductor chip; a package body that accommodates said semiconductor chip therein, said package body being defined by a pair of opposing major surfaces and surrounded by a side wall connecting said pair of opposing major surfaces, said side wall including an edge part that extends substantially straight, when viewed in a direction perpendicular to said major surfaces, to form a substantially straight edge surface; a plurality of leads held by said package body to extend substantially perpendicularly to said edge surface, each of said leads being connected to said semiconductor chip electrically, each of said leads consisting of an inner part located inside said package body and an outer lead part located outside said package body, said outer lead part being bent laterally at a boundary between said inner part and outer part, in one of first and second directions that are opposite from each other and substantially perpendicular to said opposing major surfaces; and a plurality of support legs held by said package body to extend substantially perpendicularly to said edge surface, each of said support legs consisting of an inner part located inside said package body and an outer part located outside said package body, said outer part of said support leg being bent laterally in one of said first and second directions at a boundary between said inner part and said outer part of said support leg, said outer end of said support legs being bent such that said package body is held upright when placed on a substrate. According to the present invention, the package body is held upright on the substrate by the support legs by simply placing the package body on the substrate. By causing a reflow of a solder alloy in this state, each interconnection lead is connected electrically to a corresponding conductor pattern on the substrate. Accordingly, the device of the present invention can be mounted on the substrate by surface mounting technology. Thereby, the process for inserting a stud into a corresponding hole of the substrate as practiced in a conventional device can be eliminated. Associated therewith, the process for forming the holes accurately in the substrate can also be eliminated. Thereby, the efficiency of mounting the package on the substrate is significantly improved. The package structure of the present invention has another advantageous feature in that the lead is bent laterally at the root part where it emerges from the package body. Thereby, the unnecessary extension of the leads is eliminated and the delay of the electric signals hitherto caused by such a straight part of the lead at the outside of the package body is eliminated. Associated therewith, the semiconductor device of the present invention is less vulnerable to external noises. Obviously, this advantageous feature is obtained as a result of the use of the support leg that is also bent at the root part.

Other objects and further features of the present invention will become apparent from the following detailed description when read in conjunction with the attached drawings.

BRIEF DESCRIPTION OF THE DRAWINGS

FIG. 3 is a diagram showing a single in-line package according to a first embodiment of the present invention in a bottom view;

FIG. 5 is a diagram showing the package of the first embodiment in an elevational cross sectional view;

FIG. 15 is a diagram similar to FIG. 3 showing a package according to a ninth embodiment of the present invention in a bottom view;

FIG. 17 is a diagram showing the structure of a support lead used in a package according to an eleventh embodiment of the present invention;

FIG. 18 is a diagram showing various examples of construction of the support lead of FIG. 17;

FIGS. 19(A)–19(C) are diagrams showing various modifications of the support lead of FIG. 17;

FIGS. 21(A) and 21(B) are diagrams showing a package according to a thirteenth embodiment of the present invention respectively in an end view and a top view;

DESCRIPTION OF PREFERRED EMBODIMENTS

Figure 1:
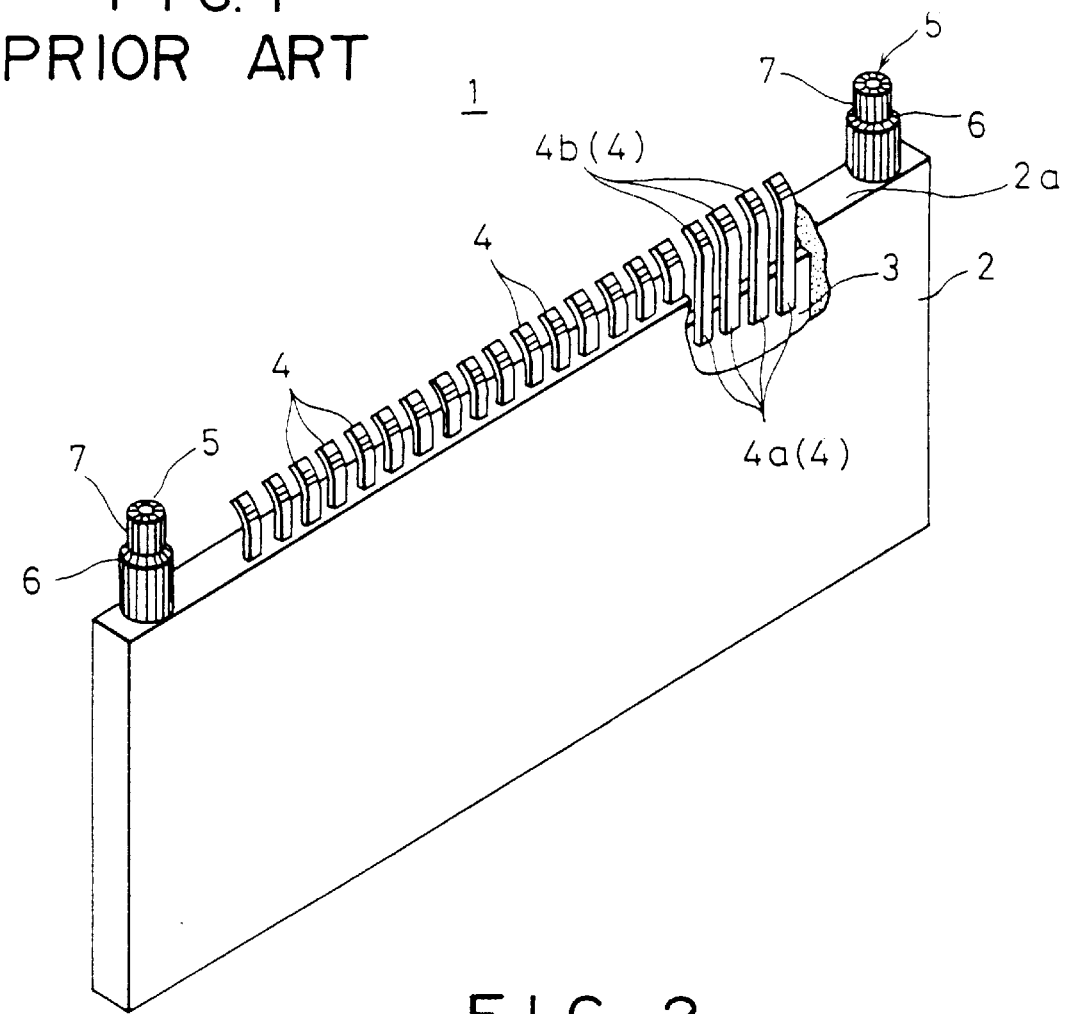
FIG. 1 is a diagram showing a conventional single in-line package designed for surface mounting in a perspective view.
Figure 2:
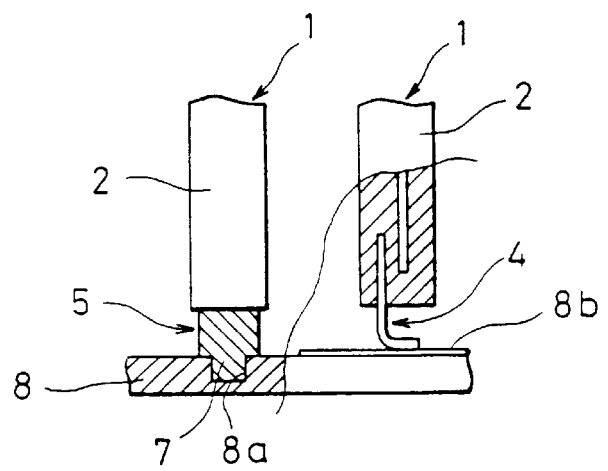
FIG. 2 is a diagram showing the mounting of the package on a substrate.

FIG. 3 shows a semiconductor device having a single in-line package according to a first embodiment of the present invention in a bottom view. Further, FIG. 4(A) shows the semiconductor device 10 in a perspective view, while FIGS. 4(B) and 4(C) show the same device respectively in an end view and a top view.

Referring to the drawings, the semiconductor device 10 includes a package body 11 of a resin such as epoxy and is formed for example by a transfer molding process. There, the package body 11 is defined by a pair of opposing major surfaces 11a and 11b as well as by walls 11c–11f, and accommodates therein a semiconductor chip 15. It should be noted that the bottom wall 11f forms the bottom edge of the package body 11 and extends straight when viewed in a direction perpendicular to the major surfaces 11a and 11b.

Figure 4A:
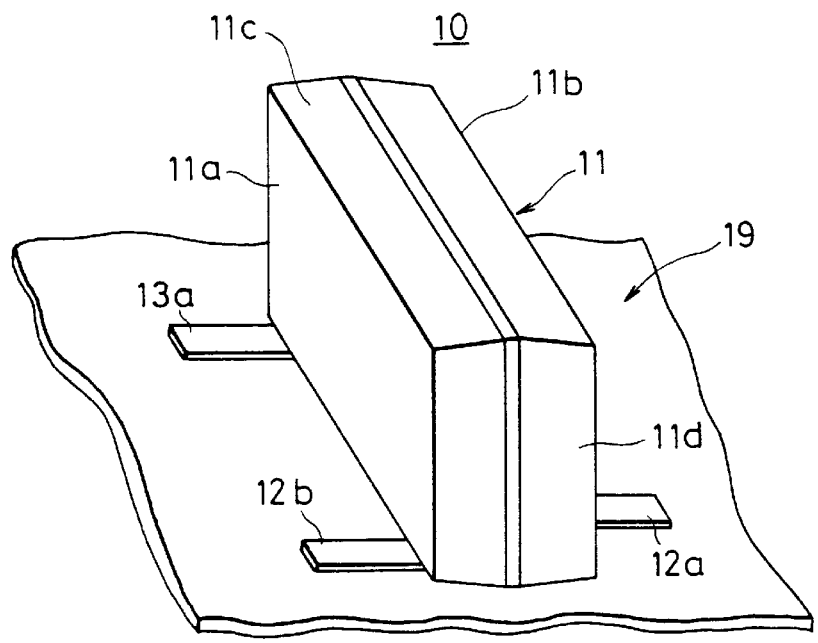
FIGS. 4(A)–4(C) are diagrams showing the package of the first embodiment respectively in a perspective view, end view and a top view.
Figure 4B:
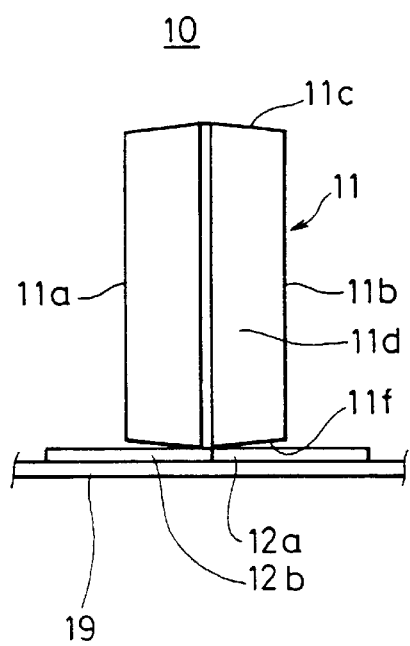
Figure 4C:
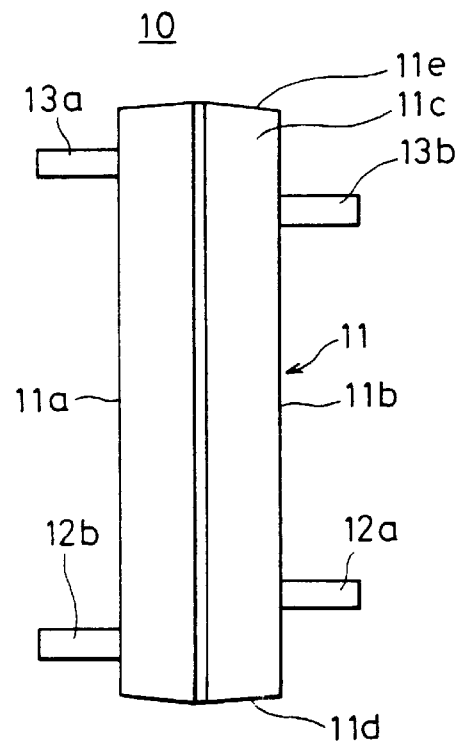

At the bottom of the package body 11, it will be seen that support legs 12a, 12b, 13a and 13b are provided to extend laterally for supporting the package body 11 on a substrate 19 as shown in FIG. 4(A). There, the legs 12a and 12b are provided at one end of the package body 11 while the support legs 13a and 13b are provided at the other end, and the support legs thus provided extend for a distance sufficient to support the package body 11 upright on the substrate 19. As will be explained later with reference to FIG. 6, each support leg is formed of a conductor strip that projects substantially perpendicularly from the bottom edge 11f in the downward direction, wherein the conductor strip is bent in a direction perpendicular to the mutually opposing major surfaces $11_a$ and $11_b$ upon emerging from the package body 11. In other words, each support leg is bent at the root part thereof and the semiconductor device 10 has an appearance as if the support legs are provided at the bottom edge 11f of the package body 11 to extend in the lateral directions. The end view of FIG. 4(B) shows the situation that the support legs 12a and 12b are bent in mutually opposing directions at the bottom edge 11f. Similarly, the support legs 13a and 13b are bent in the mutually opposing directions. It should be noted that, by providing the support legs 12a, 12b, 13a and 13b as such, the bottom edge 11f of the package body 11 is located immediately adjacent to the substrate 19 when the semiconductor device 10 is mounted as shown in FIGS. 4(A) and 4(B). In other words, the lower surface of the outer leads 14a and the lower surface of the support legs 12a–13b form a substantially flush surface.

FIG. 3 shows also a number of leads 14 provided at the bottom edge 11f of the package body 11. As will be explained later with reference to FIG. 7, each lead 14 is formed of a conductor strip that projects in the downward direction from the bottom edge 11f of the package body 11 and is bent laterally to form an outer lead part 14a. In other words, the leads 14 are bent at the root part thereof similarly to the support leads and extend in one of first and second, mutually opposite directions that are perpendicular to the major surface 11a and 11b of the package body 11. In the embodiment of FIG. 3, the outer leads 14a extend alternately in the first and second directions. Thereby, the chance of a short-circuit occurring between the adjacent leads is substantially reduced. Further, by providing the leads 14 alternately as shown in FIG. 3, one can increase the pitch of the conductor patterns that are provided on the substrate in correspondence to the leads 14. Thereby, the fabrication of the substrate becomes substantially easier.

In the embodiment of FIG. 3, it should be noted that the lateral extension of the outer lead part 14a is set as small as possible and well below the thickness of the package body 11 such that the outer lead part 14a does not extend beyond the major surfaces 11a and 11b when viewed from the bottom of the package body 11. By reducing the lateral extension of the outer lead part 14a as such, one can minimize the delay of electric signals that are transferred through the leads 14. As the bottom edge 11f of the package body 11 is located close to the substrate 19, the outer lead part 14a can establish contact with a corresponding conductor pattern provided on the substrate 19 without extending unnecessarily in the downward direction contrary to the conventional package of FIG. 1. Thus, the package of the present invention is suitable for a high speed semiconductor device wherein any delay in the electrical signal in the leads can cause a problem with proper operation. Further, the package structure of the present embodiment is less vulnerable to external noises, as the exposed part of the leads 14 is minimized.

FIG. 5 shows the internal structure of the semiconductor device 10 taken along a longitudinal cross section.

Referring to FIG. 5, the semiconductor device 10 includes a first lead frame 12 and a second lead frame 13 both embedded in the resin package body 11, wherein the first lead frame 12 has extension parts that project outside the package body as the aforementioned support leads 12a and 12b. Similarly, the second lead frame 13 has extension parts that project outside the package body as the support leads 13a and 13b. The second lead frame 13 further includes a stage part 13c for supporting the semiconductor chip 15 thereon. In the illustrated example, the stage part 13c has an elongated rectangular form in correspondence to an elongated rectangular form of the chip 15. In correspondence to the stage part 13c, the package body 11 also has an elongated rectangular form.

The semiconductor chip 15 has a number of bonding pads 16 formed along a lower edge of the chip when mounted on the lead frame 13, and each bonding pad 16 is connected to a corresponding lead 14 by a bonding wire 17. Typically, an Au wire is used for the bonding wire 17, wherein the wire 17 is bonded at an inner lead part 14b of the lead as usual. Further, some of the bonding pads 16 may be connected to the lead frames 12 and 13 for the ground connection. In this case, the support legs 12a, 12b, 13a and 13b are placed on the substrate 19 in correspondence to a ground pattern.

In fabrication, a unitary lead frame (not shown) that includes therein the lead frame 12 and the lead frame 13 is used, and the semiconductor chip 15 is mounted on such a unitary lead frame at a part that corresponds to the stage part 13c. Next, the bonding wires 17 are provided for connecting the bonding pads 16 and the corresponding leads 14, and a resin package body 11 is formed by a molding process such that the package body 11 encloses the unitary lead frame as well as the semiconductor chip 15 therein. After the package body 11 is thus formed, the unitary lead frame is cut to form the lead frames 12 and 13, and the support legs as well as the interconnection leads are formed as explained previously. Simultaneously, the interconnection leads 14 are formed. After the cutting process, the protruding conductor strips of the frames 12 and 13 are bent and the support legs 12a–13b are formed. Simultaneously, the outer lead part 14a of the lead 14 is bent laterally.

Figure 6:
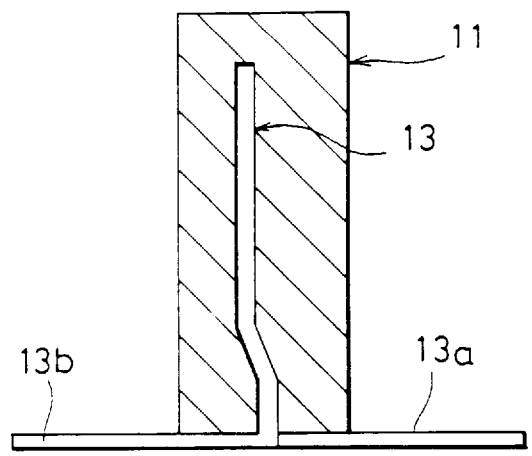
FIG. 6 is a cross sectional diagram showing the package of the first embodiment taken along line 6-6' of FIG. 5.
Figure 7:
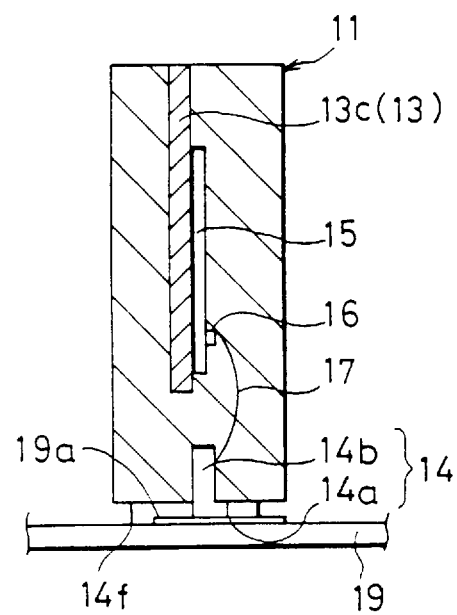
FIG. 7 is a cross sectional diagram showing the package of the first embodiment taken along line 7-7' of FIG. 5.

FIG. 6 shows the cross section of the package body 11 taken along a line 6-6' of FIG. 5, while FIG. 7 shows the cross section of the package body 11 taken along a line 7-7' of FIG. 5.

Referring to FIG. 6, it can be seen that the support legs 13a and 13b extend as a part of the lead frame 13 and are bent laterally at the root part thereof upon emerging from the package body 11. On the other hand, FIG. 7 shows the semiconductor chip 15 that is held on the stage part 13c, and the bonding wire 17 connects the bonding pad 16 on the semiconductor chip 15 to the inner lead part 14b of the interconnection lead 14. As already described, the inner lead part 14b of the lead 14 extends substantially perpendicular to the bottom edge surface 14f of the package body 11, while the outer lead part 14a is bent laterally upon emerging from the package body 11. Thereby, it will be noted that the outer lead part 14a is formed at a level substantially flush with the support legs 12a, 12b, 13a and 13b. When placed on the substrate 19, the outer lead parts 14a establish contact with a corresponding conductor pattern 19a that is provided on the substrate 19. Thus, any unnecessary vertical extension of the leads is effectively eliminated, and the delay of electrical signals in the lead 14 is minimized.

Figure 8:
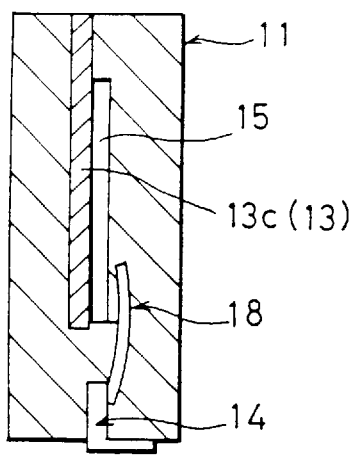
FIG. 8 is a cross sectional diagram similar to FIG. 7 showing a package according to a second embodiment of the present invention.

FIG. 8 shows a second embodiment of the present invention, wherein a tape automated bonding (TAB) process is employed for the electrical interconnection between the semiconductor chip 15 and the lead 14. As the structure of the device of the present embodiment is essentially the same as the first embodiment device except for the use of a tape lead 18 in place of the Au bonding wire 17, only the cross sectional view corresponding to FIG. 7 is shown.

By using the tape lead 18 in place of the Au bonding wire 17, the cross section of the conductor that is used for the interconnection between the chip 15 and the lead 14 can be increased. Thereby, cheap copper can be used for the material of the tape lead 18, without increasing the resistance of the interconnection. It should be noted that the diameter of the Au wire 17 cannot be increased above 25–40 $\mu$m because of the expensive cost of the material. Thereby, the device of the present embodiment is suitable for reducing the cost of a semiconductor device.

Figure 9A:
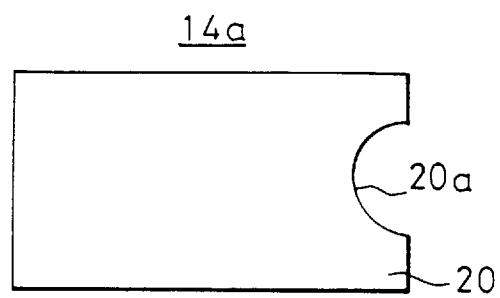
FIGS. 9(A) and 9(B) are diagrams showing an interconnection lead used in the package of FIG. 3 according to a third embodiment of the present invention.
Figure 9B:
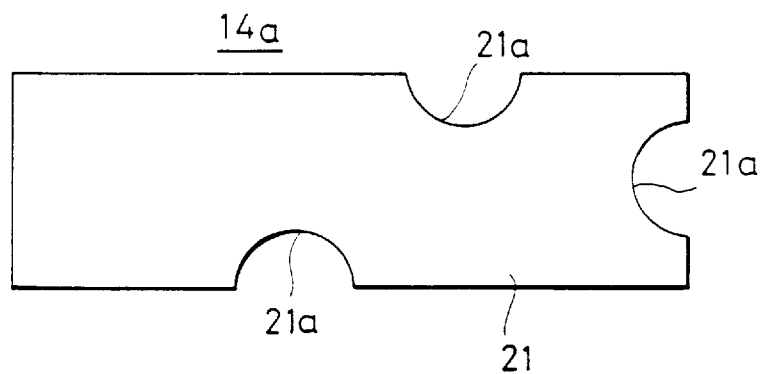

FIGS. 9(A) and 9(B) are diagrams showing a third embodiment of the present invention, wherein the lead 14 has an improved construction in correspondence to the outer lead part 14a for facilitating the soldering of the lead 14 against the conductor pattern 19a on the substrate 19. As the rest of the device structure is identical with the device of the first embodiment, only the part that is pertinent to the present embodiment will be described.

Referring to FIG. 9(A) showing the improved outer lead part 14a, there is provide a semi-circular cutout 20a in a conductor strip 20 that forms the lead 14, for increasing the area for contacting with the soldering alloy. Thereby, a firm contact is achieved, in terms of mechanical as well as electrical reliability, between the lead 14 and the conductor pattern 19a. FIG. 9(B) shows a modification of the structure of FIG. 9(A) wherein a plurality of cutouts 21a are provided in a conductor strip 21 that forms the outer lead part 14a of the lead 14.

Figure 10A:
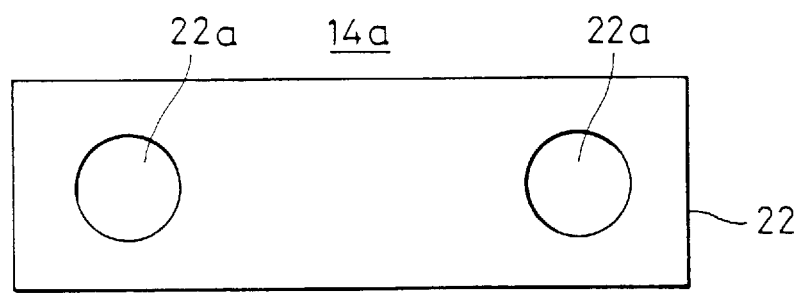
FIGS. 10(A) and 10(B) are diagrams showing an interconnection lead used in the package of FIG. 3 according to a fourth embodiment of the present invention.
Figure 10B:
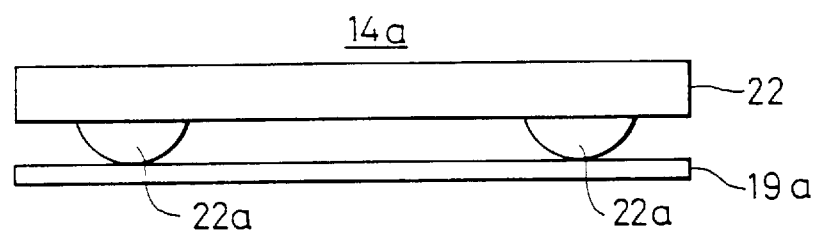

FIGS. 10(A) and 10(B) are diagrams showing a fourth embodiment of the present invention, wherein the outer lead part 14a that includes a conductor strip 22 is shown. Referring to the drawings, a pair of semispherical projections 22a are provided on the lower major surface of the conductor strip 22 to protrude in a downward direction, and corresponding depressions are formed on the upper major surface of the outer lead part 14a. There, the projections 22a establishes a contact with the conductor pattern 19a on the substrate 19 with a space formed between the conductor pattern 19a and the conductor strip 19 as shown in FIG. 10(B). In the semiconductor device of the present embodiment, the air between the conductor strip 22 and the conductor strip 19a can escape freely upon reflowing of the soldering alloy, and a firm, reliable contact can be obtained. Further, the lead 14 of the present embodiment has an improved mechanical rigidity due to the semi-spherical projections 22a. In this embodiment, too, the rest of the device structure is identical with the device of the first embodiment and further description thereof with reference to drawings will be omitted.

Figure 11:
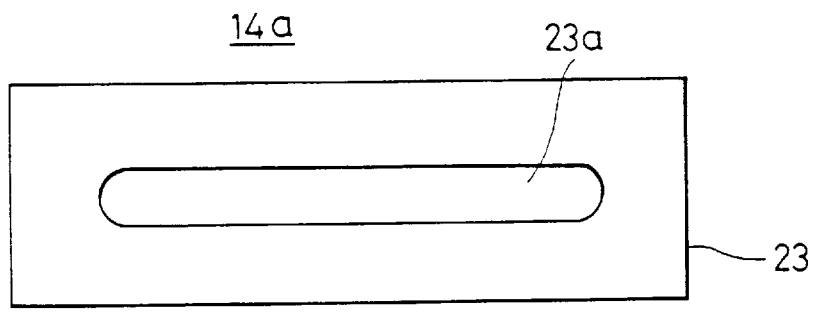
FIG. 11 is a diagram showing an interconnection lead used in the package of FIG. 3 according to a fifth embodiment of the present invention.

FIG. 11 is a diagram showing a fifth embodiment of the present invention, and shows the outer lead part 14a that includes a conductor strip 23. Referring to FIG. 11, there is provided an elongated opening 23a in the conductor strip 23 for increasing the area of contact of the outer lead 14a against the soldering alloy. Thereby, a firm and reliable electrical contact is developed between the lead 14 and the conductor pattern 19a. In this embodiment, too, the rest of the device structure is identical with the device of the first embodiment and further description thereof with reference to drawings will be omitted.

Figure 12:
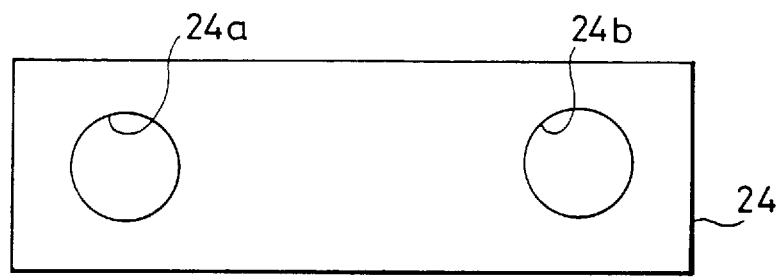
FIG. 12 is a diagram showing an interconnection lead used in the package of FIG. 3 according to a sixth embodiment of the present invention.

FIG. 12 shows a sixth embodiment of the present invention, and illustrates the outer lead part 14a that includes a conductor strip 24. Referring to FIG. 12, the conductor strip 24 is formed with a pair of circular openings 24a for increasing the area for contact with the soldering alloy. Thereby, a firm and reliable electrical contact is established between the lead 14 and the conductor pattern 19a on the substrate 19. As the rest of the device structure including the package body 11 is identical with the device of the first embodiment, further description of the present embodiment will be omitted.

Figure 13A:
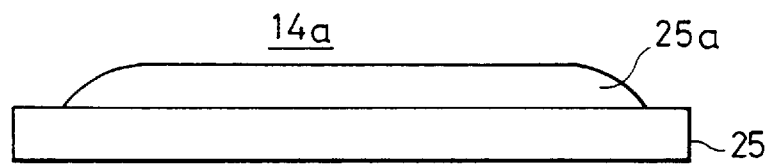
FIGS. 13(A) and 13(B) are diagrams showing an interconnection lead used in the package of FIG. 3 according to a seventh embodiment of the present invention.
Figure 13B:
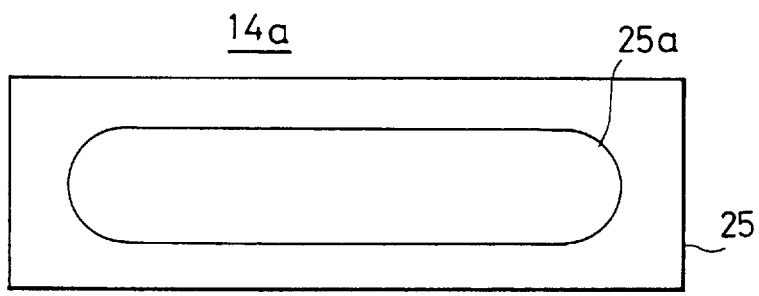

FIGS. 13(A) and 13(B) show a seventh embodiment of the present invention, and illustrate the outer lead part 14a that includes a conductor strip 25.

In this embodiment, the conductor strip 25 is formed with an elongated projection 25a that protrudes in the upward direction at the upper major surface of the conductor strip 25. By providing such a projection 25a, one can increase the rigidity of the interconnection leads 14. Instead of being provided on the upper major surface, the projection 25a may be provided on the lower major surface of the conductor strip 25 to protrude in the downward direction. By providing the projection 25a as such, the air between the substrate 15 and the conductor strip 25 can escape freely upon the reflowing of the soldering alloy, and one can obtain a reliable, firm electrical contact. As the rest of the device of the present embodiment is substantially identical with the device of the first embodiment, further description will be omitted.

Figure 14A:
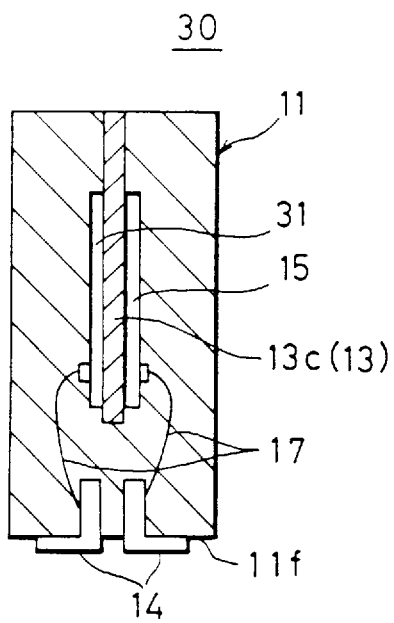
FIG. 14(A) is a diagram showing a package according to an eighth embodiment of the present invention in a transverse cross sectional view.

FIG. 14(A) shows the structure of a semiconductor device 30 according to an eighth embodiment of the present invention.

Figure 14B:
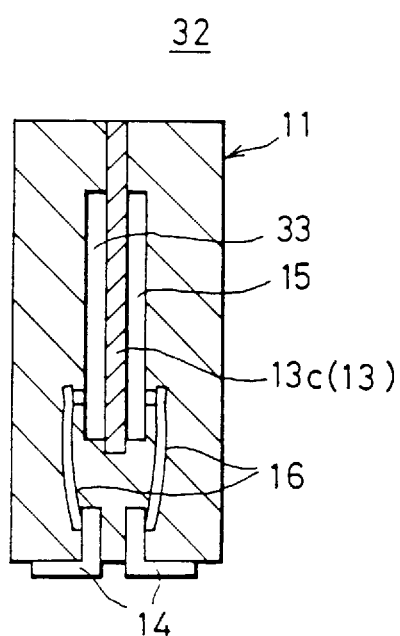
FIG. 14(B) is a diagram similar to FIG. 14(A) showing a modification of the package of FIG. 14(A)

Referring to FIG. 14(A), the semiconductor device 30 includes the package body 11 similar to the first embodiment and the lead frame 13 that includes the stage part 13c formed therein, wherein there is provided another semiconductor chip 31 on the stage part 13c at a side opposite to the side on which the semiconductor chip 15 is mounted. In correspondence to the use of the two semiconductor chips 15 and 31, the interconnection leads 14 are provided in two rows along the bottom edge 11f of the semiconductor package 11. There, the Au bonding wires 17 are provided in correspondence to both chips 15 and 31 as illustrated. By using the construction of FIG. 14(A), one can increase the density of mounting twice as much as the construction of the device of FIG. 3. FIG. 14(B) shows a semiconductor device 32 corresponding to a modification of the device of FIG. 14(A), wherein the tape lead 18 is used in place of the bonding wire 17. As the construction and function of the device of the present embodiment is obvious in view of the device of FIG. 8, further description will be omitted.

FIG. 15 is a diagram similar to FIG. 3 and shows a semiconductor device 40 according to a ninth embodiment of the present invention.

Figure 16:
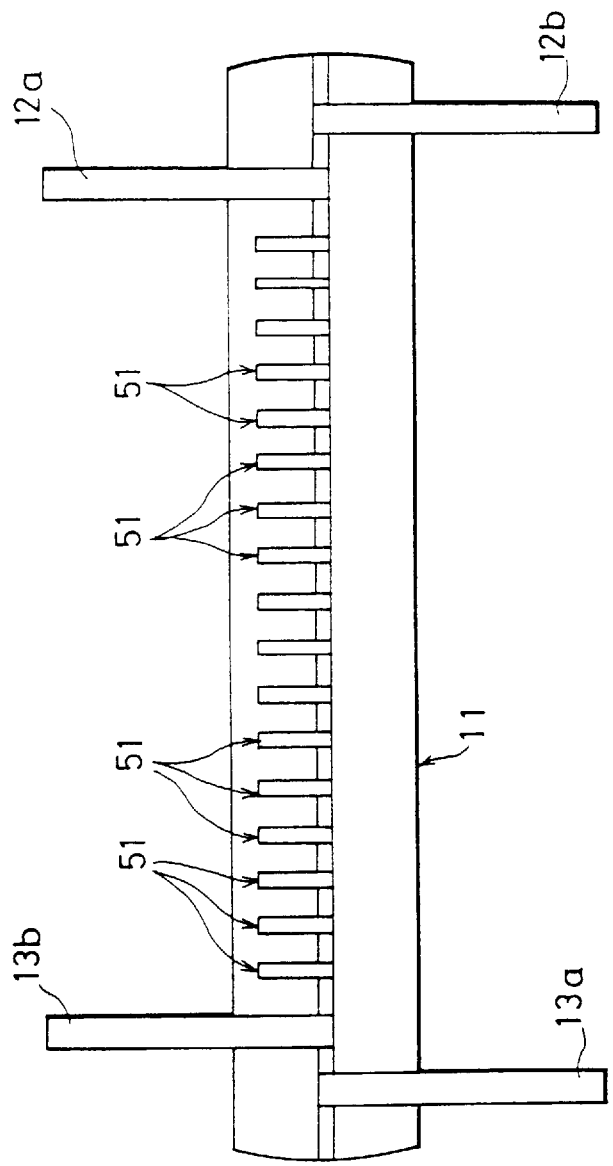
FIG. 16 is a diagram similar to FIG. 9 showing a package according to a tenth embodiment of the present invention in a bottom view.

In the embodiment of FIG. 15, the leads at the bottom edge 11f of the package body 11 are not provided alternately in the first and second directions. Instead, the leads are grouped into a number of lead pairs, each including a lead pair $41_{-1}$, and $41_{-2}$, $41_{-3}$ and $41_{-4}$, $41_{-5}$ and $41_{-6}$, etc., wherein the direction of extension of the leads is changed alternately in each lead pair. The device 40 of FIG. 15 is suitable for use in combination with the substrate 19 wherein the density or pitch of the conductor pattern is relatively sparse. FIG. 16 shows a semiconductor device 50 corresponding to a modification of the device of FIG. 15 that includes interconnection leads 51 at the bottom edge of the package body 11 in correspondence to the interconnection lead 14. In the device 50, the interconnection leads 51 extend in the same direction. Similarly to the previous device 40, this construction is useful when the interconnection leads 51 are provided with a relatively sparse pitch. Particularly, the construction of FIG. 16 is advantageous for inspecting the contact at the interconnection leads 14 visually, as such a visual inspection can be achieved from one side of the device. Thereby, the efficiency of assembling is substantially improved.

FIG. 17 is a diagram showing the cross section of the lead frames 12 and 13 according to an eleventh embodiment of the present invention. As the interconnection leads and the support legs of FIG. 3 are formed as a part of the lead frames 12 and 13 as already explained, the support legs 12a, 12b, 13a and 13b as well as the interconnection leads 14 have the same cross sectional structure as shown in FIG. 17.

Referring to FIG. 17, it will be seen that the lead frame 12 or 13 includes a plate 27c of a copper alloy (MF202—a trade name, an alloy of Cu—Sn—Zn), and clad layers 27a and 27b, both of a Fe—Ni alloy, cover the first and second, mutually opposing major surfaces, respectively. The clad layers 27a and 27b may be provided for example by a thermal bonding process. By using such a composite structure for the lead frames 12 and 13 as well as for the interconnection leads 14, it is possible to impart various preferable features of the lead frame such as a high electrical conductivity, a high mechanical strength and a high thermal conductivity.

In order to obtain the desirable property as set forth above, it is preferable to set the thicknesses $t_1$ and $t_2$ of the clad layers 27a and 27b with respect to the thickness T of the copper alloy plate 27c to satisfy a relationship $$0.3 \leq (t/T) \leq 2, \quad (1)$$

where t represents the total thickness of the clad layers 27a and 27b ($t=t_1+t_2$). Designating the total thickness of the lead frame by a parameter W as indicated in FIG. 17, it is preferable to set the ratio t/W to fall in the range $$0.4 \leq (t/W) \leq 0.7 \quad (2)$$

Within the range where the foregoing two conditions (1) and (2) are met, one can set the thickness of the layers 27a, 27b and 27c as desired. FIG. 18 shows a few examples can be set that satisfy the foregoing requirements wherein the thickness $t_1$ is set equal to the thickness $t_2$ and where the total thickness W is set at about 150 μm.

Further, it should be noted that, as long as the foregoing conditions (1) and (2) are met, the construction of the lead frame may be modified as shown in FIGS. 19(A)–19(C), where FIG. 19(A) shows a case that clad layers 27e and 27f of the copper alloy are used to cover a core layer 27d of the Fe—Ni alloy, whereas FIG. 19(B) shows a structure wherein a single clad layer 27g of the Fe—Ni alloy covers a core layer 27h of the copper alloy. Further, FIG. 19(C) shows a structure similar to the structure of FIG. 17 except that the thickness of both clad layers 27j and 27k, provided at both sides of a core layer 27i of the copper alloy in correspondence to the clad layers 27a and 27b, is made non-uniform. Even in the case of FIGS. 19(A)–19(C), a lead frame member can be obtained that has a sufficient electric and thermal conductivity as well as a sufficient mechanical rigidity, as long as the foregoing conditions (1) and (2) are met.

FIGS. 20(A)–20(F) are diagrams showing the construction of the stage part 13c according to a twelfth embodiment of the present invention.

Figure 20:
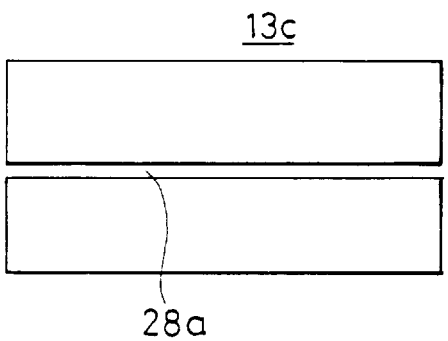
FIGS. 20(A)–20(F) are diagrams showing various constructions of the support lead for avoiding the stress concentration.
Figure 20:
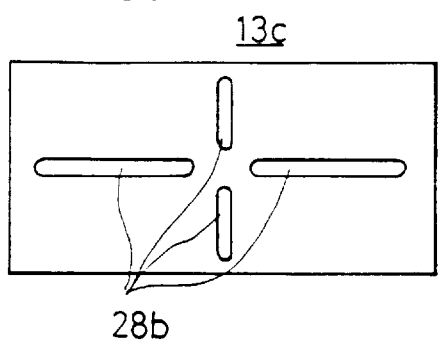
Figure 20:
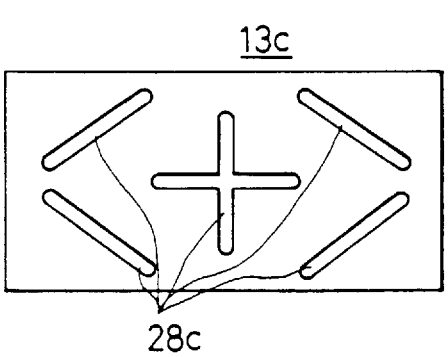
Figure 20:
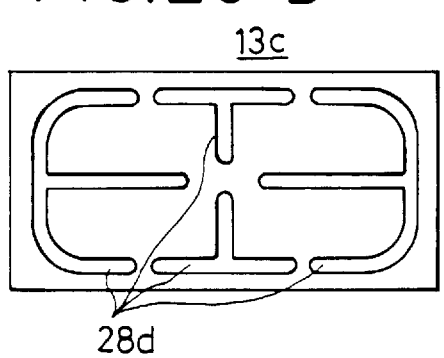
Figure 20:
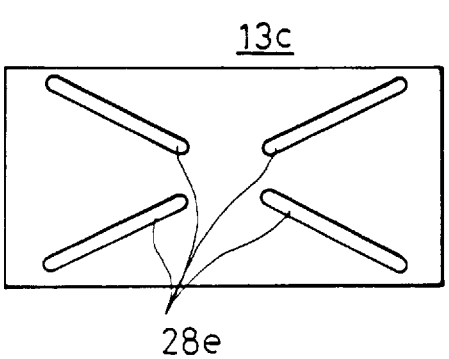
Figure 20:
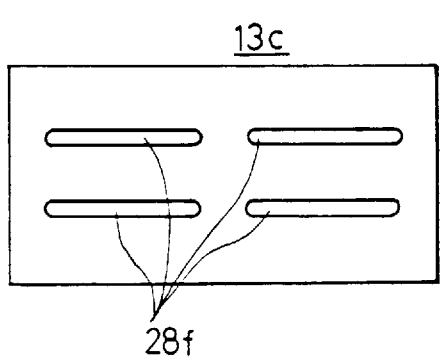

Referring to the drawings, the stage part 13c is provided with one or more apertures or openings such as an aperture 28a shown in FIG. 20(A) for absorbing mechanical stress that occurs in the stage part 13c at the time when the reflowing of the soldering alloy is achieved. It should be noted that, without such apertures provided on the stage part 13c, there is a substantial risk that the semiconductor chip 15 will come off from the stage part 13c due to the mechanical deformation caused by the difference in the thermal expansion between the lead frame 13 and the chip 15.

The aperture 28a of FIG. 20(A) extends laterally through the stage part 13c, while FIG. 20(B) shows four apertures 28b that are disposed laterally and vertically to form a cross-shaped pattern. FIG. 20(C), on the other hand, shows apertures 28c that include a cross-shaped opening at the center of the stage part 13c and four elongated openings that extend obliquely to surround the central cross-shaped pattern. FIG. 20(D) shows an aperture pattern 28d that includes a pair of T-shaped openings disposed oppositely to each other vertically and a pair of E-shaped openings that are disposed to oppose with each other laterally. FIG. 20(E) shows an aperture pattern 28e that includes four elongated openings disposed radially. Further, FIG. 20(F) shows four elongated apertures 28f that are disposed parallel with each other to extend laterally. Any of these apertures are effective in avoiding the concentration of the thermal stress particularly at the time of the reflowing of the solder alloy.

Next, a thirteenth embodiment of the present invention will be described with reference to FIGS. 21(A) and 21(B), wherein the embodiment is intended to reinforce the support legs 12a–13b against a large external force exerted upon the semiconductor device in the state that the package body 11 is held upright on the substrate 19. In the embodiment described heretofore, it should be noted that the strength or rigidity of the support legs of metal strip is not sufficient when there is a large external force applied to the package body.

Referring to FIGS. 21(A) and 21(B), showing a semiconductor device 60, the device generally has the same construction as the device 10 of FIG. 3 except that there is provided a plastic reinforcing member 63 in correspondence to each of the support legs 12a, 12b, 13a and 13b. The reinforcing member 63 has a groove 64 for engagement with each support leg and is attached on the support legs after the package body 11 is mounted firmly on the substrate 19. Thereby, the reinforcing member 63 establishes a lateral contact with the major surfaces 11a and 11b of the package body 11 and supports the package body against lateral forces schematically illustrated at A.

Figure 22A:
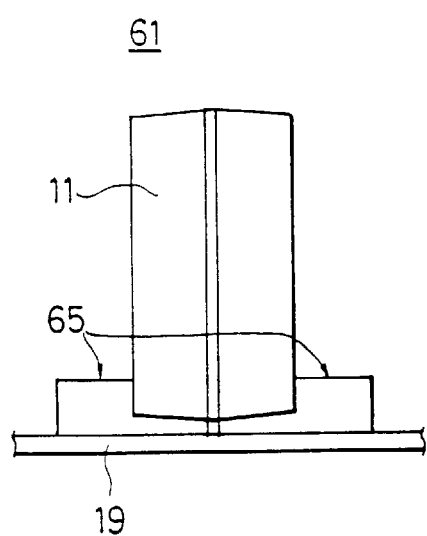
FIGS. 22(A) and 22(B) are diagrams showing a package according to a fourteenth embodiment of the present invention respectively in an end view and a top view.
Figure 22B:
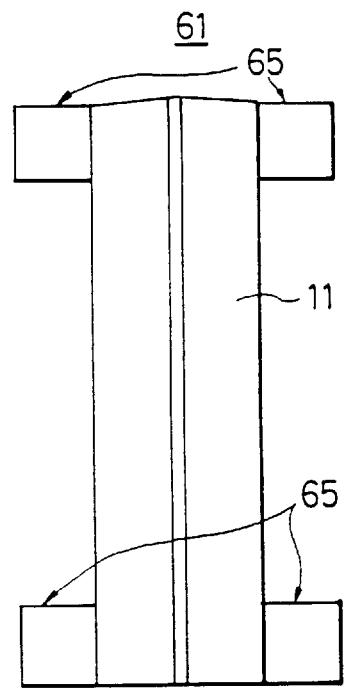
Figure 23A:
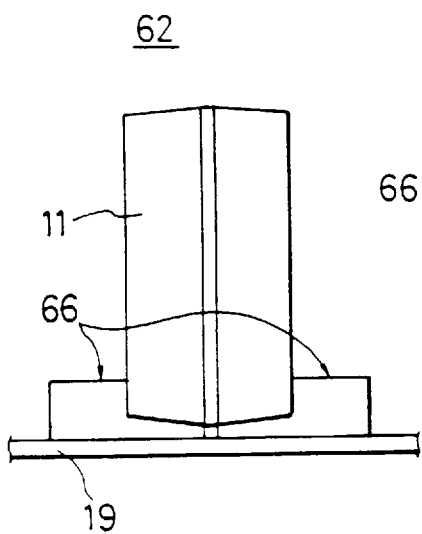
FIGS. 23(A) and 23(B) are diagrams showing a package according to a modification of the fourteenth embodiment respectively in an end view and a top view.
Figure 23B:
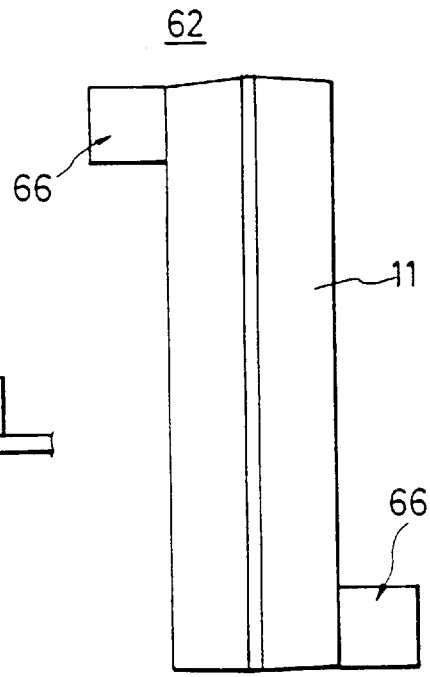

FIGS. 22(A) and 22(B) show a semiconductor device 61 according to a fourteenth embodiment of the present invention, wherein there is provided a reinforcing member 65 unitarily with the package body 11 for supporting the package body upright on the substrate 19. Thereby, the support legs of the metal strip are eliminated. As the reinforcing member 65 is formed simultaneously with the molding of the package body 11, the efficiency of production of the device can be increased. FIGS. 23(A) and 23(B) show a semiconductor device 62 corresponding to a modification of the device 61 of the fourteenth embodiment, wherein only two reinforcing members 66 are provided diagonally when viewed in the top view of FIG. 23(B). The reinforcement member 66 is formed unitarily with the package body 11 upon molding and supports the package body against lateral forces similarly to the fourteenth embodiment.

Figure 24A:
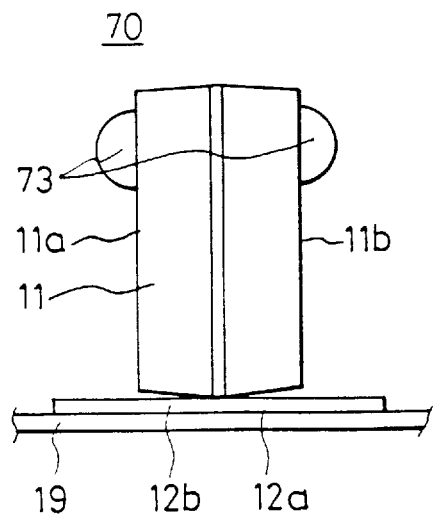
FIGS. 24(A) and 24(B) are diagrams showing the package according to a fifteenth embodiment of the present invention in an end view and a top view.
Figure 24B:
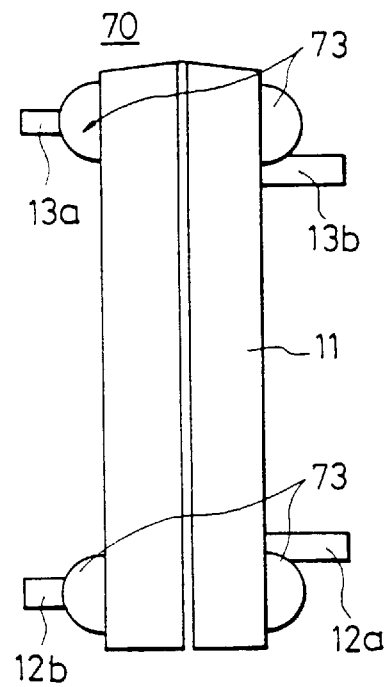

FIGS. 24(A) and 24(B) show a semiconductor device 70 according to a fifteenth embodiment of the present invention, wherein the present embodiment provides a package structure suitable for mounting with a plurality of devices having a reduced mutual separation.

It should be noted that, when a number of the semiconductor devices are mounted on the substrate 19, it is inevitable that a separation or gap is formed between the adjacent devices. Thereby, each semiconductor device stands upright without effective lateral supporting except for the fragile support legs. It should be noted that the reinforcing members described with reference to the thirteenth and fourteenth embodiments tend to increase the mutual separation between the devices as they will abut with each other when the separation between the adjacent devices is reduced.

The embodiment of FIGS. 24(A) and 24(B) is intended to provide a lateral support of the upright package body on the substrate when the semiconductor devices are mounted in a large mounting density, and includes semispherical projections 73 protruding laterally from the two major surfaces 11a and 11b of the package body 11 as shown in FIG. 24(A). Such lateral projections 73 are provided to oppose each other as shown in the plan view of FIG. 24(B).

Figure 25:
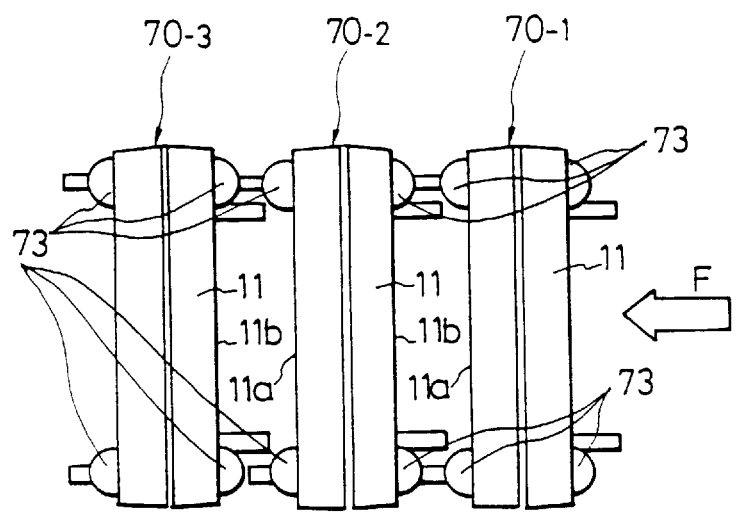
FIG. 25 is a diagram showing the mounting of the package of the fifteenth embodiment on a substrate.

FIG. 25 shows a number of semiconductor devices $70_{-1}$, $70_{-2}$, $70_{-3}$, . . . that are provided on a substrate (not shown). As shown in FIG. 25, the devices are arranged on the substrate such that the semi-spherical projections 73 of adjacent devices oppose with each other. Thus, when one of the devices such as the semiconductor device $70_{-2}$ is tilted toward the device $70_{-3}$ by an external force F, for example, the semi-spherical projection 73 on the major surface 11a of the device $70_{-2}$ makes a contact with the corresponding projection 73 provided on the major surface 11b of the device $70_{-3}$. Thereby, the device $70_{-2}$ is supported laterally against tilting by the device $70_{-3}$.

Figure 26A:
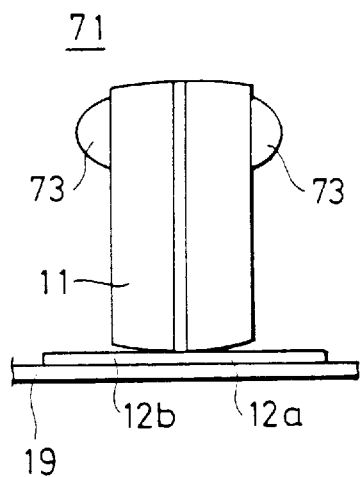
FIGS. 26(A) and 26(B) are diagrams showing a modification of the fifteenth embodiment respectively in an end view and a top view.
Figure 26B:
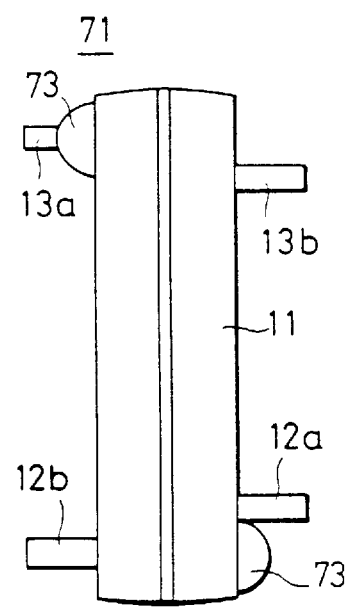

The number of the semi-spherical projections 73 is not limited to four as in the embodiment of FIG. 25 but can be reduced to two as in the semiconductor device 71 of FIGS. 26(A) and 26(B). There, the projections 73 are formed along one of the diagonal lines when viewed in the plan view of FIG. 26(B).

Figure 27A:
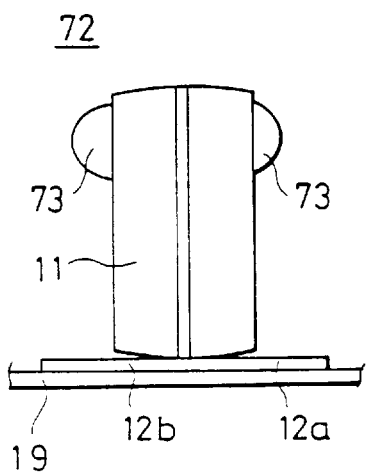
FIGS. 27(A) and 27(B) are diagrams showing another modification of the fifteenth embodiment respectively in an end view and a top view.
Figure 27B:
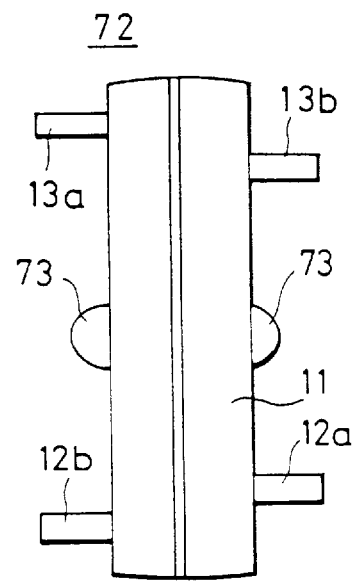

FIGS. 27(A) and 27(B) show another modification 72 of the semiconductor device of the present embodiment. In the present device 72, the projections 73 are provided along the top edge of the package body 11 as shown in the end view of FIG. 27(A), while it will be seen in the plan view of FIG. 27(B) that the projections 73 are provided to oppose each other in a central part of the package body 11.

Figure 28A:
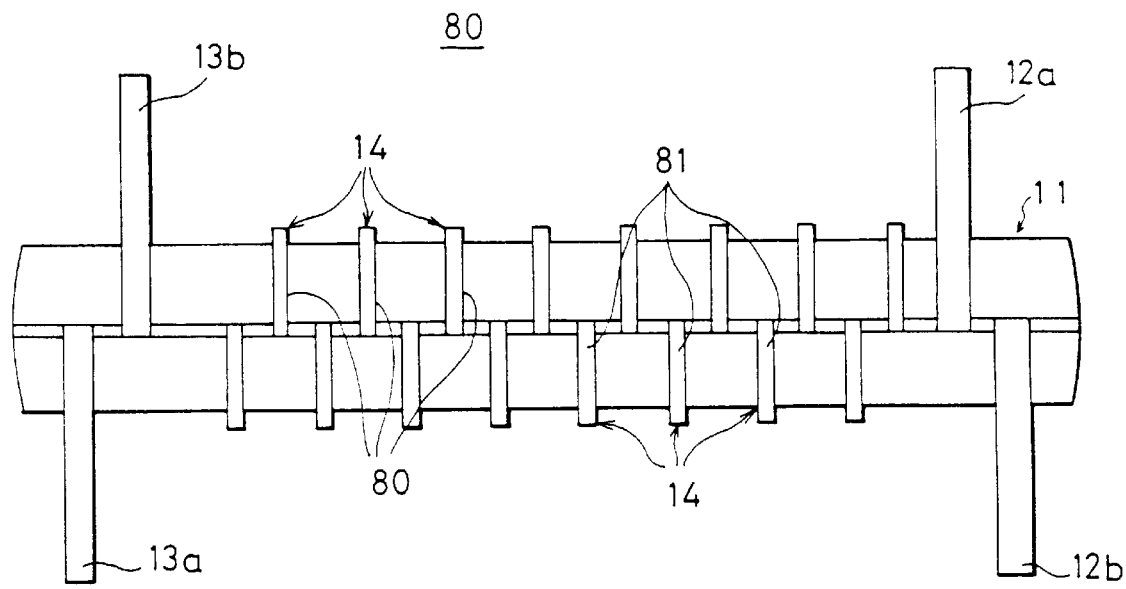
FIGS. 28(A) and 28(B) are diagrams showing a semiconductor device according to a sixteenth embodiment of the present invention.

FIG. 28(A) shows a semiconductor device 80 according to a sixteenth embodiment of the present invention.

Referring to FIG. 28(A) showing the device 80 in a bottom view, the semiconductor device 80 includes the interconnection lead 14, wherein an outer lead part 81 of the interconnection lead 14 extends beyond the package body 11 by a length of 0.1–0.2 mm. Similar to the first embodiment, the outer lead part 81 extend alternately in opposite directions. By providing the lead 14 as such visual inspection of the connection of th interconnection becomes easier.

Figure 28B:
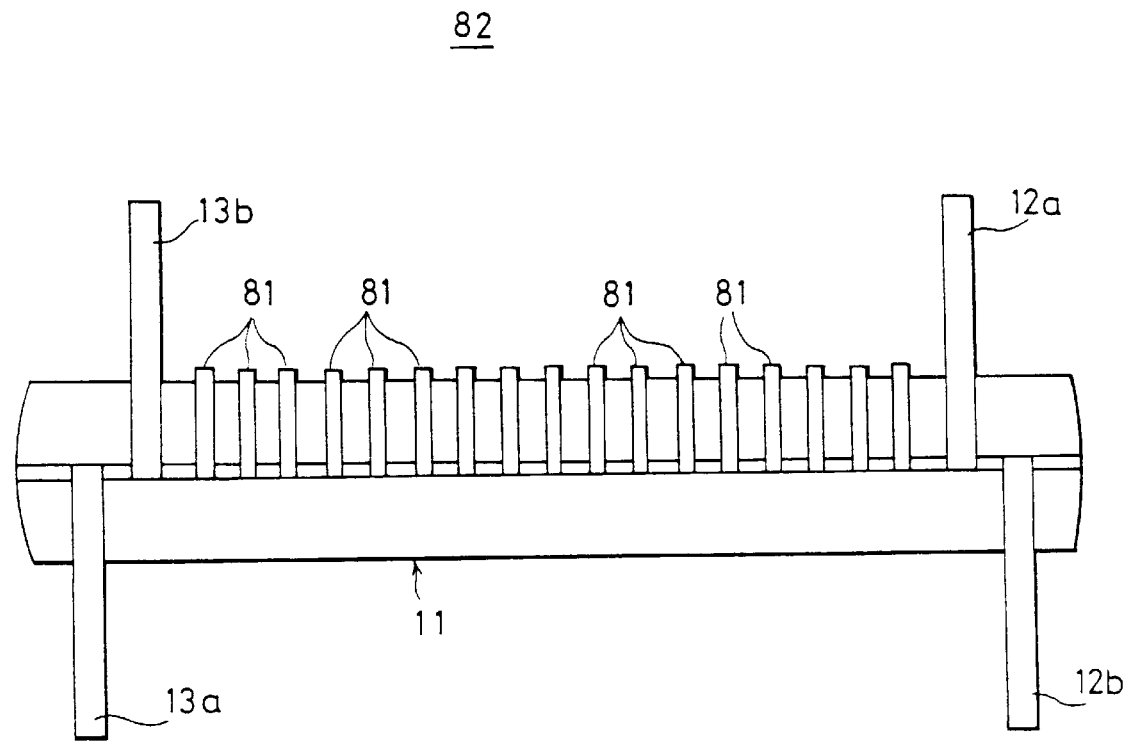

FIG. 28(B) shows a modification 82 of the semiconductor device of FIG. 28(A), wherein the outer leads 81 extend in the same direction. In this embodiment, the easiness of visual inspection is even more improved.

Further, the present invention is not limited to the embodiments described heretofore, but various variations and modifications may be made without departing from the scope of the invention.

What is claimed is:

1. A semiconductor device having a package of a single in-line type, comprising:

a semiconductor chip;

a package body that accommodates the semiconductor chip therewithin, the package body being defined by a pair of opposing major surfaces connected by a bottom wall, the bottom wall including a substantially planar edge part that extends substantially perpendicular to the major surfaces, the package body further comprising a stage member embedded therein and supporting the semiconductor chip thereon;

a plurality of interconnection leads held by the package body so as to extend substantially perpendicularly to the edge surface, each of the interconnection leads being connected to the semiconductor chip electrically, each of the interconnection leads consisting of an inner lead part located inside the package body and an integral, outer lead part located outside the package body and having a distal end, the outer lead part being bent laterally, relatively to the inner lead part, at a boundary between the inner lead part and the outer lead part, in one of first and second directions that are opposite to each other and substantially perpendicular to the opposing major surfaces; and a plurality of support legs formed as a unitary body with the stage member and held by the package body so as to extend substantially perpendicularly to the edge surface and in the first and second directions, each of the support legs consisting of an inner part located inside the package body and a corresponding outer part located outside the package body and bent laterally in one of the first and second directions at a boundary between the corresponding inner and outer parts, the outer leg parts extending beyond the distal ends of the outer lead parts and supporting the package body, when placed on a substrate, in an upright position relatively to the substrate.

2. A semiconductor device as claimed in claim 1 in which said semiconductor device includes an additional semiconductor chip, said stage member having first and second, mutually opposing major surfaces, said semiconductor chip and said additional semiconductor chip being provided on said first and second major surfaces of said stage member respectively.

3. A semiconductor device as claimed in claim 1 in which each of said stage member, said support legs and said interconnection leads comprises a composite conductor body comprising a first layer of a copper alloy and a second layer of an iron alloy stacked with each other, said first layer having a first thickness t while said second layer having a second thickness T, wherein there holds a relationship $$0.3 \leq t/T \leq 2$$

between the first and second thicknesses.

4. A semiconductor device as claimed in claim 3 in which said composite conductor body has first and second opposing major surfaces separated with each other by an overall thickness W, wherein there holds a relationship $$0.4 \leq t/W \leq 0.7$$

between the first thickness and the overall thickness.

5. A semiconductor device as claimed in claim 3 in which said copper alloy contains Cu, Sn and Zn, while said iron alloy contains Fe and Ni.

6. A semiconductor device as claimed in claim 1 in which said stage member is provided with an opening for dispersing a stress applied thereto.

7. A semiconductor device package of a single in-line type, comprising:

a semiconductor chip;

a package body housing the semiconductor chip therewithin and defined by a pair of spaced, opposing major sidewalls and a bottom wall extending between and interconnecting the opposing major sidewalls, a portion of the bottom wall comprising a planar edge surface which lies in a plane substantially transverse to the major sidewalls, the package body further comprising a stage member embedded therein and supporting the semiconductor chip thereon;

a plurality of interconnection leads, each lead comprising an inner lead part disposed and secured within the package body and electrically connected to the semiconductor chip and an outer lead part extending integrally from the inner lead part, exteriorly of the package body, the respective inner lead parts of the plurality of interconnection leads being aligned in parallel relationship, intermediate the major sidewalls of the package body and the corresponding outer lead parts of the plurality of interconnection leads being bent, relatively to the corresponding inner lead parts and toward the bottom wall, so as to extend laterally in one of first and second, opposite directions from the planar edge surface; and a plurality of support legs formed as a unitary body with the stage member, each support lea comprising an inner leg part secured within the package body and an outer lea part extending from the inner leg part and emerging substantially perpendicularly from the planar edge surface, an outer leg part of each support leg being bent and extending laterally and exteriorly of the package body, in a selected one of the first and second directions, relatively to the planar edge surface, the outer leg parts of the support legs being of a longer dimension than the outer lead parts of the interconnection leads and supporting the package body, when the outer leg parts are received on a supporting substrate; such that the pair of major sidewalls of the package is disposed in an erect position relatively to the substrate.

8. The semiconductor device package of claim 7, wherein the successive outer lead parts are bent, in alternating succession and respectively, in the first and second opposite directions.

9. The semiconductor device package of claim 7, wherein all of the outer lead parts are bent in a selected, common one of the first and second directions.

10. The semiconductor device package of claim 7, wherein the outer lead parts are arranged in plural groups, each group comprising plural outer lead parts and wherein successive groups of the outer lead parts are bent, in alternating succession and respectively, in the first and second opposite directions.

11. The semiconductor device package of claim 7, wherein the outer lead parts have corresponding distal ends and the outer leg parts have corresponding distal ends, the distal ends of the outer leg parts being disposed laterally outwardly of the distal ends of the outer lead parts.

12. The semiconductor device package of claim 7, wherein the outer lead parts of the plurality of interconnection leads are bent, in alternating succession and respectively, in the first and second directions.

13. The semiconductor device package of claim 7, wherein the stage member has first and second mutually opposing major surfaces and wherein the semiconductor chip is mounted on the first major surface, further comprising;

a second semiconductor chip, the second semiconductor chip being mounted on the second major surface of the lead frame.

14. A semiconductor device package of a single in-line type, comprising:

a semiconductor chip;

a package body housing the semiconductor chip therewithin and defined by a pair of spaced, opposing major sidewalls and a bottom wall extending between and interconnecting the opposing major sidewalls, the bottom wall including an edge surface which lies in a plane substantially transverse to the major sidewalls;

a plurality of interconnection leads, each lead comprising an inner lead part and an outer lead part, the inner lead part disposed and secured within the package body and electrically connected to the semiconductor chip and the outer lead part extending integrally from the inner lead part, exteriorly of the package body, the plurality of interconnection leads being intermediate the major sidewalls of the package body and the corresponding outer lead parts of the plurality of interconnection leads being bent, relatively to the corresponding inner lead parts and toward the bottom wall, so as to extend laterally in one of first and second, opposite directions from the planar edge surface; and a lead frame comprising a stage member portion having a chip mounting surface on which the semiconductor chip is mounted and a plurality of support legs disposed in correspondence to, and emerging from, the planar edge surface, an outer leg part of each support leg being bent and extending, exteriorly of the package body, laterally in a selected one of the first and second directions from the planar edge surface, the outer leg parts of the support legs being of a longer dimension than the outer lead parts of the interconnection leads and supporting the package body.

15. The semiconductor device package of claim 14, wherein successive the outer lead parts are bent, in alternating succession and respectively, in the first and second opposite directions.

16. The semiconductor device package of claim 14, wherein all of the outer lead parts are bent in a selected, common one of the first and second directions.

17. The semiconductor device package of claim 14, wherein the outer lead parts are arranged in plural groups, each group comprising plural outer lead parts and wherein successive groups of the outer lead parts are bent in alternating succession and respectively, in the first and second opposite directions.

18. The semiconductor device package of claim 14, wherein the outer lead parts have corresponding distal ends and the outer leg parts have corresponding distal ends, the distal ends of the outer leg parts being disposed laterally outwardly of the distal ends of the outer lead parts.

19. The semiconductor device package of claim 14, wherein the outer lead parts of the plurality of support legs are bent, in alternating succession and respectively, in the first and second directions.

20. A semiconductor device package of a single in-line type, comprising:

a semiconductor chip;

a package body housing the semiconductor chip therewithin and defined by a pair of spaced, opposing major sidewalls and a bottom wall extending between and interconnecting the opposing major sidewalls, a portion of the bottom wall comprising a planar edge surface which lies in a plane substantially transverse to the major sidewalls;

a plurality of interconnection leads, each interconnection lead comprising an inner lead part disposed and secured within the package body and electrically connected to the semiconductor chip and an outer lead part extending integrally from the inner lead part and exteriorly of the package body, the respective inner lead parts of the plurality of interconnection leads being aligned in parallel relationship, intermediate the major sidewalls of the package body, and the corresponding outer lead parts of the plurality of interconnection leads being bent, relatively to the corresponding inner lead parts and toward the bottom wall, so as to extend laterally in one of first and second, opposite directions from the planar edge surface;

a plurality of support legs, each support leg comprising an inner leg part secured within the package body and an outer leg part extending from the inner leg part and emerging from the planar edge surface, the inner leg parts of the plurality of support legs being disposed in a common plane intermediate the pair of spaced, opposing major side walls, the outer leg part of each support leg being bent and extending, exteriorly of the package body and laterally in a selected one of the first and second, opposite directions relatively to the planar edge surface, the outer leg parts of the support legs being of a longer dimension than the outer lead parts of the interconnection leads and supporting the package body when the outer leg parts are received on a supporting substrate and such that the pair of major sidewalls of the package is disposed in an erect position relatively to the substrate; and each of the plurality of interconnection leads and each of the plurality of support legs having a common thickness and being formed of a common material composition.

21. The semiconductor device package of claim 20, wherein the outer lead parts are bent, in alternating succession and respectively, in the first and second opposite directions.

22. The semiconductor device package of claim 20, wherein all of the outer lead parts are bent in a selected, common one of the first and second directions.

23. The semiconductor device package of claim 20, wherein the outer lead parts are arranged in plural groups, each group comprising plural outer lead parts, and wherein successive groups of the outer lead parts are bent, in alternating succession and respectively, in the first and second opposite directions.

24. The semiconductor device package of claim 20, wherein the outer lead parts have corresponding distal ends and the outer leg parts have corresponding distal ends, the distal ends of the outer leg parts being disposed laterally outwardly of the distal ends of the outer lead parts.

25. The semiconductor device package of claim 20, wherein the outer lead parts of the plurality of interconnection leads are bent, in alternating succession and respectively, in the first and second directions.

26. The semiconductor device package of claim 20, further comprising a lead frame embedded within the package body and supporting the semiconductor chip thereupon.

27. The semiconductor device package of claim 20, wherein the corresponding inner leg parts of at least selected support legs, of the plurality of support legs, are integral with the lead frame.

28. The semiconductor device package of claim 20 wherein the lead frame has first and second mutually opposing major surfaces and wherein the semiconductor chip is mounted on the first major surface, further comprising;

a second semiconductor chip, the second semiconductor chip being mounted on the second major surface of the lead frame.

29. A semiconductor device package of a single in-line type, comprising:

a semiconductor chip;

a package body housing the semiconductor chip therewithin and defined by a pair of spaced, opposing major sidewalls and a bottom wall extending between and interconnecting the opposing major sidewalls, the bottom wall including an edge surface which lies in a plane substantially transverse to the major sidewalls;

a plurality of interconnection leads, each lead comprising an inner lead part and an outer lead part, the inner lead parts being disposed in a common plane parallel to and intermediate the major sidewalls and secured within the package body and electrically connected to the semiconductor chip and the outer lead parts extending integrally from the corresponding inner lead parts, exteriorly of the package body, the corresponding outer lead parts of the plurality of interconnection leads being bent, relatively to the corresponding inner lead parts and toward the bottom wall, so as to extend laterally in one of first and second, opposite directions from the planar edge surface;

a lead frame comprising a chip mounting surface on which the semiconductor chip is mounted and a plurality of support legs, each support leg comprising an inner support leg part integral with the lead frame and disposed with the lead frame in the common plane and an outer support leg part extending integrally from the inner leg part and emerging from the planar edge surface, the outer leg part of each support leg being bent and extending, exteriorly of the package body, laterally in a selected one of the first and second directions from the planar edge surface, the outer leg parts of the support legs being of a longer dimension than the outer lead parts of the interconnection leads and supporting the package body; and each of the plurality of interconnection leads and each of the plurality of support legs having a common thickness and being formed of a common material composition.

30. The semiconductor device package of claim 29, wherein the outer lead parts are bent, in alternating succession and respectively, in the first and second opposite directions.

31. The semiconductor device package of claim 29, wherein all of the outer lead parts are bent in a selected, common one of the first and second directions.

32. The semiconductor device package of claim 29, wherein the outer lead parts are arranged in plural groups, each group comprising plural outer lead parts, and wherein successive groups of the outer lead parts are bent, in alternating succession and respectively, in the first and second opposite directions.

33. The semiconductor device package of claim 29, wherein the outer lead parts have corresponding distal ends and the outer leg parts have corresponding distal ends, the distal ends of the outer leg parts being disposed laterally outwardly of the distal ends of the outer lead parts.

34. The semiconductor device package of claim 29, wherein the outer lead parts of the plurality of interconnected leads are bent, in alternating succession and respectively, in the first and second directions.

35. The semiconductor device package of claim 29 wherein the lead frame includes first and second mutually opposing major surfaces and wherein the semiconductor chip is mounted on the first major surface, further comprising:

a second semiconductor chip the second semiconductor chip being mounted on the second major surface of the lead frame.

36. A semiconductor device package of a single in-line type, comprising:

a semiconductor chip;

a package body housing the semiconductor chip therewithin and defined by a pair of spaced, opposing major sidewalls and a bottom wall extending between and interconnecting the opposing major sidewalls, a portion of the bottom wall comprising an edge surface which lies in a plane substantially transverse to the major sidewalls;

a plurality of interconnection leads, each lead comprising an inner lead part disposed and secured within the package body and electrically connected to the semiconductor chip and an outer lead part extending integrally from the inner lead part, exteriorly of the package body, the respective inner lead parts being disposed in a common plane parallel to and spaced intermediate the major sidewalls of the package body and secured therewithin and the corresponding outer lead parts of the plurality of interconnection leads being bent, relatively to the corresponding inner lead parts and toward the bottom wall, so as to extend laterally in a selected one of first and second, opposite directions relatively to the planar edge surface; and a first lead frame, embedded in the package body, comprising a chip carrier portion for supporting the semiconductor chip and a plurality of first support legs integral with and extending from the chip carrier portion for supporting the package, each first support leg comprising at least an inner leg part integral with the first lead frame and disposed therewith in the common plane and a corresponding outer leg part, the outer leg parts being of a longer dimension than the outer lead parts and extending exteriorly of the package body and laterally, transversely to the major sidewalls of the package body;

a second lead frame, embedded in the package body, comprising a plurality of second support legs for supporting the package, each support leg comprising at least an inner leg part integral with the second lead frame and disposed therewith in the common plane and a corresponding an outer leg part, the outer leg parts being of a longer dimension than the outer lead parts and extending exteriorly of the package body and laterally, transversely to the major sidewalls of the package body.

37. The semiconductor device package of claim 36, wherein the outer lead parts are bent, in alternating succession and respectively, in the first and second opposite directions.

38. The semiconductor device package of claim 36, wherein all of the outer lead parts are bent in a selected, common one of the first and second directions.

* * * * *

UNITED STATES PATENT AND TRADEMARK OFFICE
CERTIFICATE OF CORRECTION

PATENT NO.: 5,861,669
DATED : January 19, 1999
INVENTOR(S): Michio SONO et al.

It is certified that error appears in the above-identified patent and that said Letters Patent is hereby corrected as shown below:

Col. 2,      line 23, delete "one cannot reduce".

Col. 7,      line 40, change "establishes" to --establish--.

Col. 8,      line 66, change "lead" to --leads--.

Col. 9,      line 43, delete "one can set".

Col. 10,    line 21, change "to oppose with" to --oppositely to--.

Col. 11,    line 26, delete "with";
line 54, change "part" to --parts--;
line 55, after "such" insert --,--;
line 56, change "th" to --the--.

UNITED STATES PATENT AND TRADEMARK OFFICE
CERTIFICATE OF CORRECTION

PATENT NO.:    5,861,669
DATED      :   January 19, 1999
INVENTOR(S):   Michio SONO et al.

It is certified that error appears in the above-identified patent and that said Letters Patent is hereby corrected as shown below:

Col. 12,    line 29, after "laterally" insert --,--.

Col. 13,    lines 27 and 29, change "lea" to --leg--;

line 38, change ";" to --,--.

Col. 15,    line 62, change "20" to --26--.

Signed and Sealed this

Sixth Day of July, 1999

Attest:

Q. TODD DICKINSON

*Attesting Officer*　　　*Acting Commissioner of Patents and Trademarks*